United States Patent [19]
Yosefin et al.

[11] Patent Number: 5,952,875
[45] Date of Patent: Sep. 14, 1999

[54] CIRCUIT WITH HOT ELECTRON PROTECTION AND METHOD

[75] Inventors: Mark Yosefin, Jerusalem; Yachin Afek, Saba; Joseph Shor, Raanana, all of Israel

[73] Assignee: Motorola Inc., Austin, Tex.

[21] Appl. No.: 08/926,002

[22] Filed: Sep. 9, 1997

[51] Int. Cl.[6] .................................................. H01L 27/06
[52] U.S. Cl. ........................ 327/545; 327/546; 327/538; 327/108; 326/81; 326/83
[58] Field of Search .................. 326/81, 82, 83; 327/530, 535, 333, 108, 546, 384, 385, 437, 420, 538, 545

[56] References Cited

U.S. PATENT DOCUMENTS 5,381,061  1/1995  Davis ........................................ 326/57
5,444,397  8/1995  Wong et al. ............................... 326/81
5,570,043  10/1996  Churchill ................................. 326/81
5,666,069  9/1997  Gibbs ....................................... 326/81

*Primary Examiner*—Dinh Le

[57] ABSTRACT

An I/O circuit whose output receives a voltage $V_{PAD}$ which is temporarily higher than a critical voltage $V_{DS\ MAX} > V_{DS\ 1}$ across drain and source of a conducting first N-FET (110, N1) acting as a pull-down device. The first N-FET is protected against hotelectron induced degradation by a serially coupled second N-FET (130, N3). A variable drain-source voltage $V_{DS\ 3}$ is added to $V_{DS\ 1}$. A comparator (150) compares the received voltage $V_{PAD}$ to a supply voltage $V_{CC}$ and pulls a gate (G) of the second N-FET (N3) to $V_{PAD}$ or to $V_{CC}$. The conductivity of the second N-FET (N3) is thereby changed so that VPAD is distributed among $V_{DS\ 1}$ and $V_{DS\ 2}$. The comparator (150) conveniently comprises two P-FETs (P1, P2, 160, 170).

15 Claims, 3 Drawing Sheets

CIRCUIT WITH HOT ELECTRON PROTECTION AND METHOD

RELATED INVENTIONS

The present invention is related to the commonly assigned U.S. application: "Circuit with Hot-Electron Protection and Method" by Joseph S. Shor et. al., having Ser. No. 08/837,136 filed on Apr. 14, 1997 [1] whose subject matter is hereby incorporated by reference into the disclosure of this invention.

FIELD OF THE INVENTION

This invention relates to electronic devices, and especially to input-output circuits and to a method for operating input-output circuits.

BACKGROUND OF THE INVENTION

Advances in very large scale integration (VLSI) fabrication techniques for integrated circuits (IC) are often based on reduced transistor dimensions (e.g., channel length) without a proportional scaling of the reference voltages. The reduction of critical transistor dimensions results in a significant increase of the electrical fields in the transistors. When for example, a N-channel field effect transistor (N-FET) is conductive in the deep saturation region, then its gate oxide can be damaged by high electrical fields. The results are, for example, longer delay times and a lower long-term reliability of the IC. Consequences known in the art under the terms 'hot-carrier induced degradation' and 'hot electron effects' are described in Leblebici, Y.: "Design Considerations for CMOS Digital Circuits with Improved Hot-Carrier Reliability", IEEE J. of Solid State Circuits, vol. 31, No. 7, p. 1014–1024 (1996) [2].

FIGS. 1–2 explain details of the problem which is reduced or solved by the present invention. FIG. 1 is a simplified circuit diagram of a prior art electronic system 11 having first circuit 10 and second circuit 20. Electronic system 11 represents an I/O (input/output) connection. Circuits 10 and 20 are coupled by signal line 15 and reference line 19. Signal line 15 is also referred to as "PAD".

Circuit 10 receives a low supply voltage $V_{CC\ 1}$ (e.g., $V_{CC\ 1}$=3.3 volts) at supply line 91; and circuit 20 receives a higher supply voltage $V_{CC\ 2}$ (e.g., $V_{CC\ 2}$=5.5 volts) at supply line 92, so that:

$$V_{CC\ 1} < V_{CC\ 2}. \tag{1}$$

$V_{PAD}$ is the potential between lines 15 and 19 and can be:

$$0 < V_{PAD} < V_{CC\ 2}. \tag{2}$$

Circuit 10 comprises N-FETs N2 and N1 serially coupled with drain (D) and source (S) electrodes between signal line 15 and reference line 19. A gate (G) of N-FET 1 is coupled to input terminal 90; and a gate (G) of N-FET N2 is coupled to supply line 91 at $V_{CC\ 1}$. Voltages across D and S of N-FET N1 and N-FET N2 are $V_{DS\ 1}$ and $V_{DS\ 2}$, respectively. N-FETs N1 and N2 are voltage sensitive components, whose $V_{DS\ 1}$ and $V_{DS\ 2}$ should not exceed a critical voltage ("break voltage") $V_{DS\ MAX}$:

$$V_{DS\ 1,2} \leq V_{DS\ MAX} \tag{3}$$

when either of N-FETs N1 or N2 is conductive. When N-FETs N1 and N2 are not conductive, then $V_{DS\ 1,2}$ can exceed $V_{DS\ MAX}$. It is inconvenient, when $V_{DS\ MAX}$ is lower than $V_{CC\ 2}$:

$$V_{DS\ MAX} < V_{CC\ 2} \tag{4}$$

In circuit 20, switch 25 is coupled between supply line 92 and signal line 15. The operation of switch 25 is not communicated to circuit 10. Circuit 20 can temporarily pull $V_{PAD}$ (signal line 15) to the higher supply voltage $V_{CC\ 2}$ so that N-FETs N1 and N2 could be damaged.

FIG. 2 is a simplified voltage-time diagram illustrating the operation of system 11 of FIG. 1 by way of example. FIG. 2 refers to a pull-down operation when N-FETs N1 and N2 pull line 15 to line 19. A pull-up operation in the opposite direction is not considered. Traces 31–32 for $V_{PAD}$ and traces 41–43 for $V_{DS1}$ are coordinated by a vertical voltage-axis "V" (0 volts to $V_{CC\ 2}$=5.5 volts) and a horizontal time-axis "t" (in nano seconds ns). Line 51 between traces 31 and 41 and lines 52–53 between traces 32 and 43 show:

$$V_{DS\ 2} = V_{PAD} - V_{DS\ 1} \tag{5}$$

It is assumed that $V_{DS\ MAX}$ is about 3.6 volts. In a time interval between t=0 and t=$t_1$, (e.g., at $t_1$=2 ns), $V_{PAD}$ is at its maximum value $V_{CC\ 2}$ =5.5 volts (trace 31, equation 2). N-FETs N1 and N2 are not conducting. N-FET N1 adds its $V_{DS\ 2}$ (line 51) to $V_{DS\ 1}$ of N-FET N1 (trace 41), thus fulfilling condition (3).

At time $t_1$, N-FET N1 is made conductive by, e.g., an input signal at its gate G (input terminal 90), and $V_{DS\ 1}$ goes quickly to substantially zero (at 0.5 volts, trace 42) so that N-FET N1 is not damaged. In the interval after $t_1$, $V_{DS\ 1}$ stays at zero (trace 43). However, $V_{PAD}$ decreases slowly (trace 32), so that between $t_1$ and $t_2$, $V_{DS\ 2}$ (line 52) exceeds temporarily $V_{DS\ MAX}$. $V_{DS\ 2}$ across N-FET N2 reaches its allowable value $V_{DS\ 2} = V_{DS\ MAX}$ only at $t_2$ (equation 3, line 53).

In FIG. 3 of related application [1], a control circuit (reference number 20) switches the gate of N-FET N2 (signal G2) alternatively between a voltage VCCL (corresponding to $V_{CC\ 1}$ in FIG. 1) and VCCH (corresponding to $V_{CC\ 2}$). With a temporarily increased conductivity of N-FET N2, voltage $V_{DS\ 2}$ falls faster so that the time interval $t_1$ and $t_2$ can be reduced. However, such a solution is not always applicable, because circuit 10 would require two supply voltages ($V_{CC\ 1}$ and $V_{CC\ 2}$). This is especially difficult to implement when circuit 10 and circuit 20 separated by a significant distance.

There is a need to design an I/O connection which mitigates or avoids these and other disadvantages and limitations of the prior art.

DETAILED DESCRIPTION OF A PREFERRED EMBODIMENT

Figure 3:
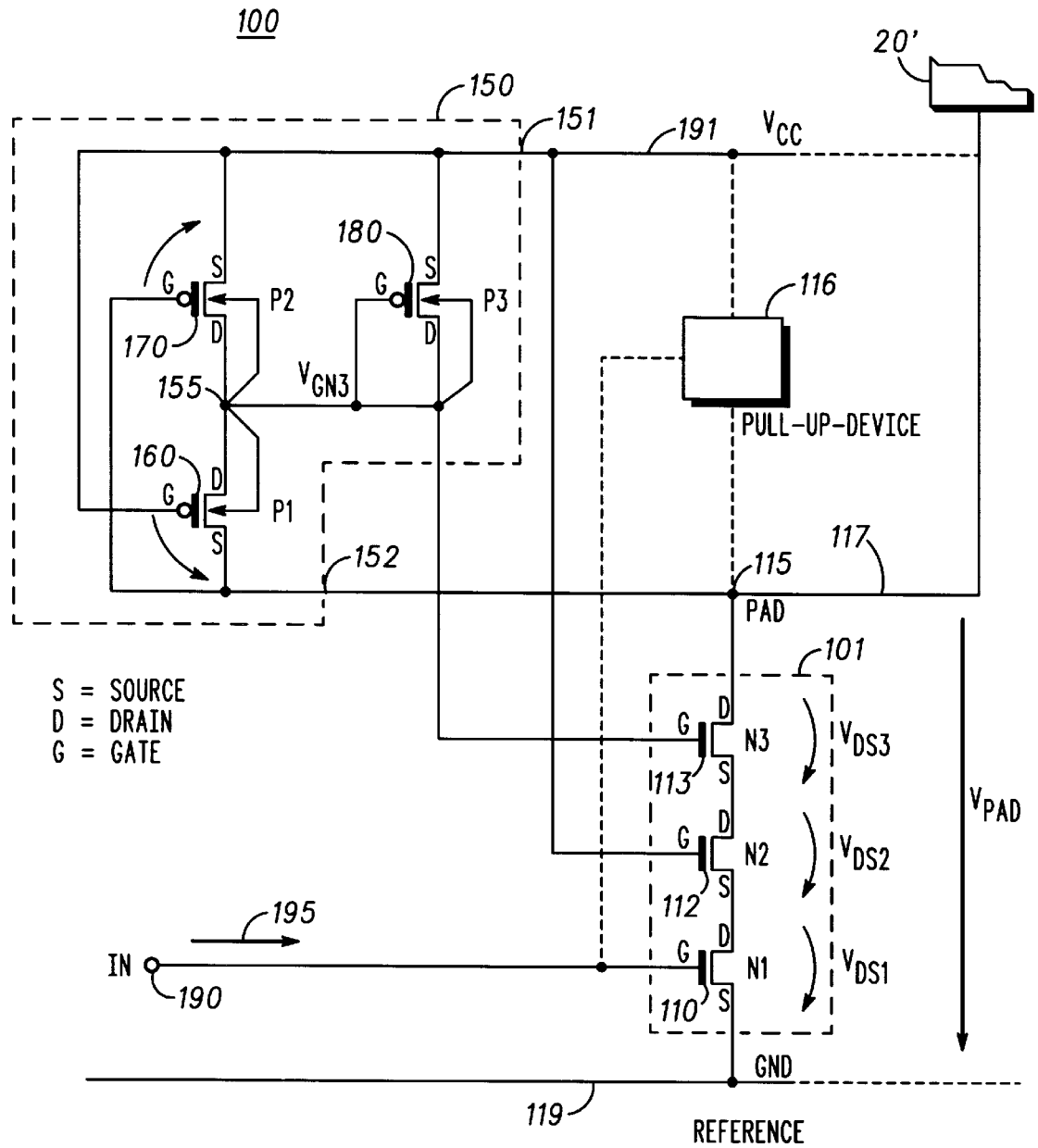
FIG. 3 is a simplified circuit diagram of a circuit illustrating a preferred embodiment of the present invention.

FIG. 3 is a simplified circuit diagram of circuit 100 illustrating a preferred embodiment of the present invention.

Figure 1:
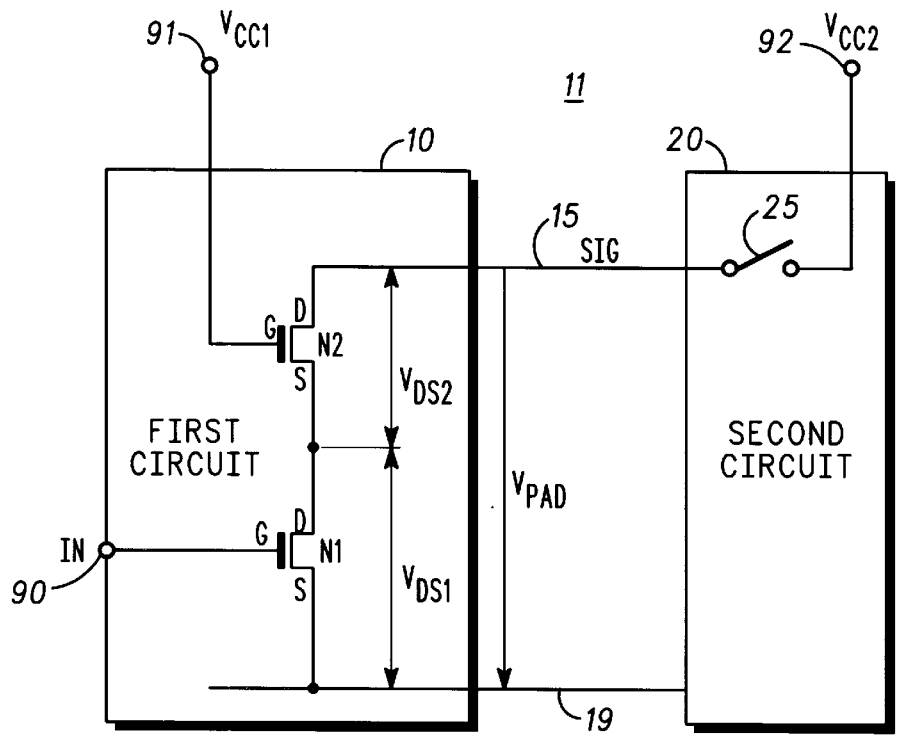
FIG. 1 is a simplified circuit diagram of an prior art electronic system having a first circuit and a second circuit.

Input-output (I/O) circuit 100 (hereinafter circuit 100) comprises pull-down device 101 with transistors 110, 120 and 130, (hereinafter N1, N2, and N3, respectively), node 115 (also: "PAD" or "line"), optional pull-up device 116, comparator 150 (also: "switch network") with transistors 160, 170 and 180 (hereinafter P1, P2 and P3, respectively). Optionally provided transistors N2 and P3 are convenient but not essential for the present invention. Circuit 100 has reference line 119 with reference potential $V_{R1}$ (or "GND" of e.g., 0 volts) and reference line 191 with a reference potential $V_{R2}$ (or "$V_{CC}$" of e.g., 2.5 volts). Lines 119 and 191 are also referred to as "terminals". Similar to prior art circuit 10 of FIG. 1, circuit 100 is coupled to a further circuit, such as e.g., circuit 20' (cf. FIG. 1) by node 115 and either one or both of lines 119 or 191. Optionally, circuit 100 receives input signal 195 via input terminal 190 and provides output signal 117 at node 115.

N1, N2, and N3 are preferably N-channel field effect transistors each having a gate (G), a drain (D) and a source (S). The term "transistor" is intended to include any device having at least two main electrodes and a control electrode which is controlled by a signal applied to the control electrode. Transistors, such as N1, N2, N3, P1, P2, and P3 can be e.g., FETs having drain (D), source (S) as main electrodes and gates (G) as control electrode. Transistors can also be bipolar transistors with collectors (C) and emitters (E) as main electrodes and bases (B) as control electrodes, or other devices.

Transistors N1, N2, and N3 are, preferably, field effect transistors (FETs) of the N-channel type (N-FETs) and transistors P1, P2 and P3 of comparator 150 are, preferably, field effect transistors (FETs) of the P-channel type (P-FETs), symbolized by a circle at the gate. This is convenient for explanation, but not essential. A person of skill in the art will apply apparatus and method of the present invention for other configurations, such as complementary configurations with N-FETs in comparator 150 and P-FETs in pull-down device 101. Although the preferred embodiment has been implemented in CMOS-technology, a person of skill in the art is able, based on the description herein, to use the present invention with other technologies, with for example, all transistors of equal conductivity types.

The transistors and the other mentioned elements of circuit 100 are coupled, preferably, as follows: Pull-up device 116 which is not essential for the invention, is illustrated as coupled with dashed lines between line 191 and node 115. Preferably, pull-up device 116 receives input signal 195 from input terminal 190. Pull-down device 101 is coupled between node 115 and line 119 with transistors N3, N2, and N1 serially coupled together. The order in which transistors N3, N2, and N1 are arranged is convenient, but not essential for the invention. In detail, the drain (D) as main electrode of N1 is coupled to node 115, the source (S) as the other main electrode of N1 is coupled to the drain (D) of N2. The source (S) of N2 is coupled to the drain (D) of N1. The source (S) of N1 is coupled to line 119. The gate (G) as control electrode of N1 is coupled to input terminal 190 and receives input signal 195. The gate (G) of transistor N2 is coupled to line 191 receiving predetermined potential $V_{CC}$. The gate (G) of transistor N3 is coupled to output node 155 of comparator 150 and receives either the potential of node 115 ($V_{PAD}$) or the potential of line 191 ($V_{CC}$).

In comparator 150, transistors P2 and P1 are serially coupled between line 191 and node 115. The drain (D) of P2 is coupled to the drain (D) of P1 at output node 155. The source (S) of P1 is coupled to node 115. The gate (G) of P2 is coupled to node 115 and the gate (G) of P1 is coupled to line 191. The gates (G) of P1 and P2 form comparator inputs 151 and 152, respectively. Optional transistor P3 has its source (S) coupled to line 191 and its drain (D) and gate (G) coupled together to output node 155. P3 prevents node 155 from drifting when $V_{PAD}=V_{CC}$. Comparator 150 can be implemented in various ways, provided that it measures the potential difference between line 191 and line 115 and provides a control signal to transistor N3 so as to vary the S-D impedance of transistor N3 to act as a potential divider redistributing the voltage $V_{PAD}$ across pull-down device 101 so that none of transistors N1, N2, or N3 is exposed to a voltage $V_{DS} > V_{DS\ MAX}$.

A person of skill in the art is able to couple bulks (or wells) of transistors N1, N2, N3, P1, P2, and P3 to lines 191, 119 or to other points, but such further details are not illustrated for simplicity. It is convenient to couple bulks of P1 and P2 (in FIG. 3, arrows pointing to the gate circles) to output node 155, since, as further explanation will show, node 155 has either the potential of $V_{PAD}$ or of $V_{CC}$, whichever is higher.

For explanation, voltages and their function are introduced. Voltages across D and S of transistors N1, N2, and N3 are $V_{DS\ 1}$, $V_{DS\ 2}$, and $V_{DS\ 3}$, respectively, which should not exceed the above mentioned allowable voltage $V_{DS\ MAX}$:

$$V_{DS\ 1,2,3} \leq V_{DS\ MAX} \tag{6}$$

Figure 2:
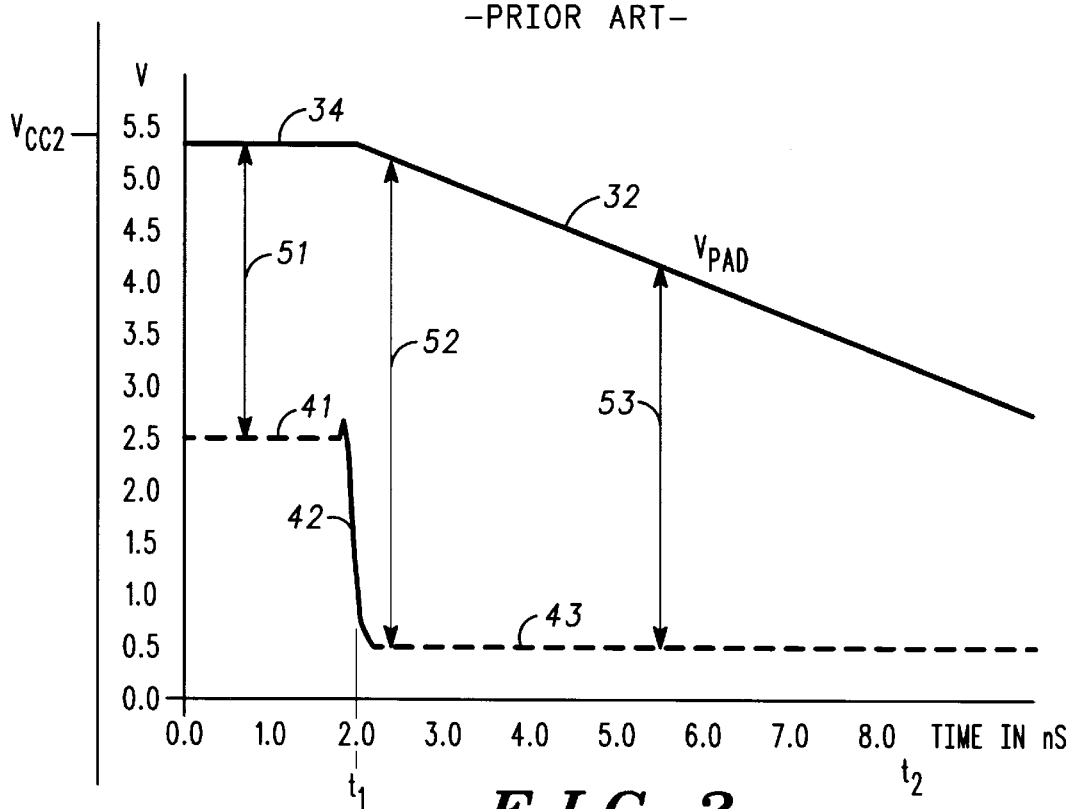
FIG. 2 is a simplified voltage-time diagram illustrating the operation of the system of FIG. 1 by way of example.

N-FETs N1, N2 and N3 are voltage sensitive components. As discussed in connection with FIGS. 1–2 in the background section, the further circuit imposes a potential $V_{PAD}$ between node 115 and line 119 (GND potential). $V_{PAD}$ is the sum of $V_{DS\ 1,2,3}$:

$$V_{PAD} = V_{DS\ 1} + V_{DS\ 2} + V_{DS\ 3} \tag{7}$$

$V_{PAD}$ can be temporarily higher than the maximum allowable voltage $V_{DS\ MAX}$ (cf. equation 3) across transistors N1, N2, and N3.

Voltages between gate (G) and (S) of N-channel transistors N1, N2, and N3 are referred to as $V_{GS\ N1}$, $V_{GS\ N2}$, $V_{GS\ N3}$, respectively (in general $V_{GS\ N}$). These transistors are assumed to be conductive ("ON") thus able to carry a current between D and S when $V_{GS\ N}$ is equal or higher a threshold voltage $V_{th\ N}$ (of e.g., 0.2 volts), or otherwise non-conductive ("OFF"):

$$V_{GS\ N} \geq V_{th\ N} \text{ (conductive, "ON")} \tag{8}$$

$$V_{GS\ N} < V_{th\ N} \text{ (non-conductive, "OFF")} \tag{9}$$

Comparator 150 has an output voltage $V_{GN3}$ defined between the gate (G) of N3 and line 119 (GND).

Voltages between G and S of P-channel transistors P1 and P2 are referred to as $V_{GS\ P1}$ and $V_{GS\ P2}$, respectively, (in general $V_{GS\ P}$) and control P1 and P2 according to:

$$V_{GS\ P} \leq V_{th\ P} \text{ (conductive, "ON")} \tag{10}$$

$$V_{GS\ P} > V_{th\ P} \text{ (non-conductive, "OFF")} \tag{11}$$

with a threshold voltage $V_{th\ P}$ of e.g., minus 0.2 volts. Having, preferably, comparator 150 configured as in FIG. 3, the gate-source voltages of P1 and P2 and their influence on circuit behavior are for example:

(a)

$$V_{GS\ P1} = V_{CC} - V_{PAD} \tag{12}$$

making P1 conductive for $V_{PAD} \geq V_{CC} + |V_{th\ P}|$ and (13)

providing $V_{GN3} \approx V_{PAD}$ (14)

(b)

$V_{GS\ P2} = V_{PAD} - V_{CC}$ (15)

making P2 conductive for $V_{CC} \geq V_{PAD} + |V_{th\ P}|$ and (16)

providing $V_{GN3} \approx V_{CC}$ (17)

The threshold voltage is given within || symbols for absolute value. In case of $V_{CC} \approx V_{PAD}$, that is when $|V_{PAD} - V_{CC}| < |V_{th}|$, transistor P3 provides $V_{GN3} \approx V_{CC}$. For convenience of further explanation, $|V_{th\ P}|$ having a small magnitude compared to e.g., $V_{CC}$ and $V_{PAD}$ can be neglected in the following.

Comparator 150 ("switch network") protects transistors N1, N2, and N3 by comparing voltages $V_{CC}$ at reference line 191 and $V_{PAD}$ at node 115 (PAD) and switches the control input (e.g., the gate) of transistor N3 alternatively to reference line 191 (at $V_{CC}$) and node 115 ($V_{PAD}$). The voltage $V_{DS\ 3}$ across transistor N3 thereby alternates so that the voltages $V_{DS\ 1}$ across transistor N1, $V_{DS\ 2}$ across transistor N2 and transistor N3 are always smaller than the maximum allowable voltage $V_{DS\ MAX}$.

Figure 4:
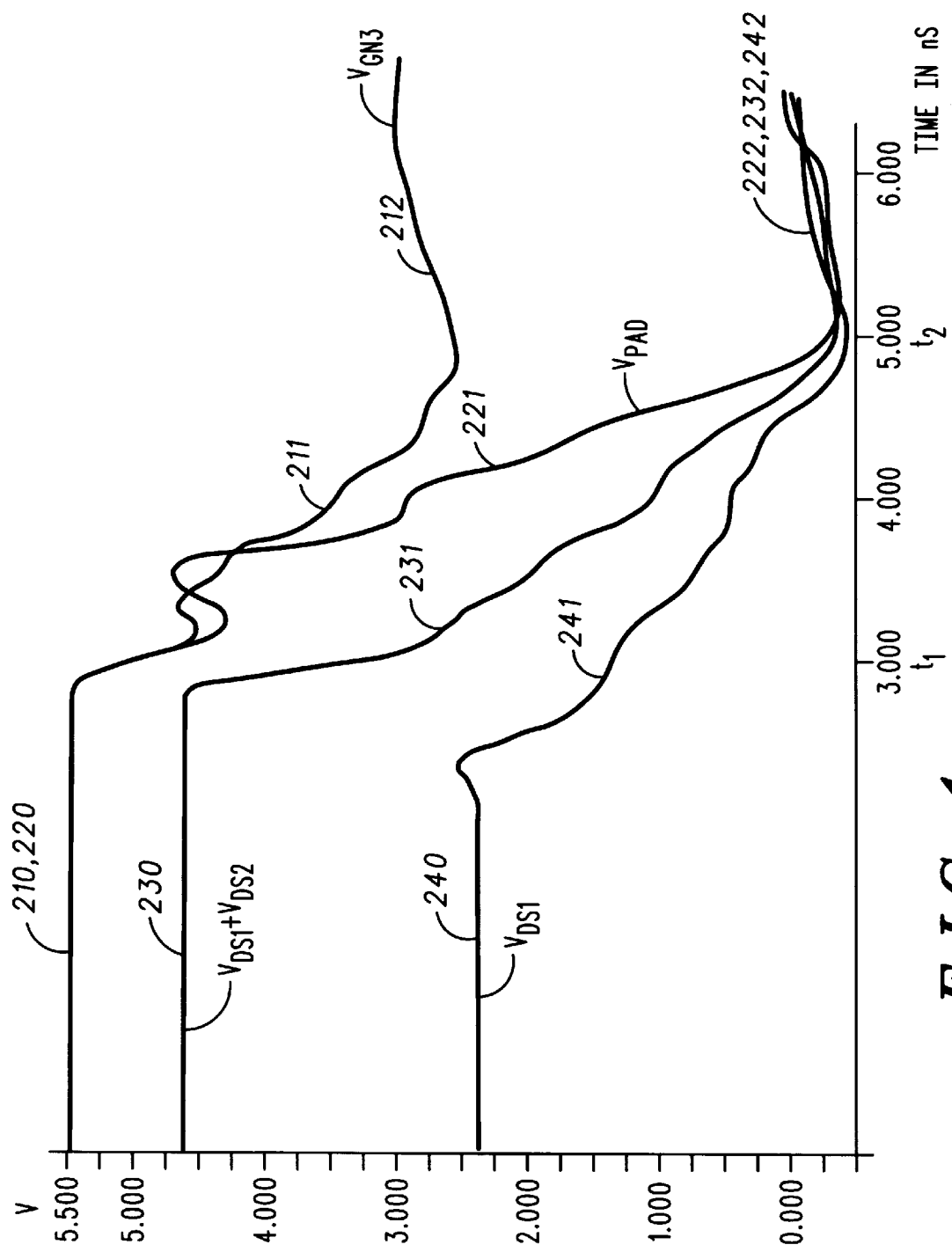
FIG. 4 is a simplified voltage-time diagram illustrating a method of the present invention to operate the circuit of FIG. 3.

A method of the present invention to protect transistors against "hot-electrons" is better understood in reference to an example in a voltage-time representation which was obtained by simulation. FIG. 4 is a simplified voltage-time diagram illustrating a method of the present invention to operate circuit 100 of FIG. 3. FIG. 4 was obtained by SPICE-investigation of circuit 100. SPICE is a simulator well known in the art, but a person of skill in the art could used other simulators and obtain similar results. The diagram of FIG. 4 has vertical a voltage-axis "V" (0 volts to 5.5 volts) and a horizontal time-axis "t" (in nano seconds). Circuit 100 receives $V_{CC}$=3.3 volts at line 191 and receives $V_{PAD}$=5.5 volts at node 115. It is assumed that $V_{PAD}$ is determined by whatever additional circuitry (e.g., circuit 20') is coupled to line 115.

In the example of FIG. 4, traces 210–212 illustrate the output voltage $V_{GN3}$ of comparator 150 applied to the gate (G) of transistor N3; traces 220–222 illustrate $V_{PAD}$ across transistors N1, N2 and N3; traces 230–232 illustrate the sum voltage $V_{DS\ 1} + V_{DS\ 2}$ across N1 and N2; and traces 240–242 illustrate the voltage $V_{DS\ 1}$ across transistor N1. The voltage $V_{DS\ 2}$ across N2 can be seen as the distance between traces 230–232 ($V_{DS\ 1} + V_{DS\ 2}$) and traces 240–242 ($V_{DS\ 1}$). The voltage $V_{DS\ 3}$ across N3 can be seen as the distance between traces 220–222 ($V_{PAD}$) and traces 230–232 ($V_{DS\ 1} + V_{DS\ 2}$). A critical voltage of $V_{DS\ MAX}$=3.6 volts is not exceed by any $V_{DS}$ at any time.

At time t<$t_1$, $V_{DS\ 1,2,3} < V_{DS\ MAX}$ of serially coupled transistors N1, N2, and N3 are added to $V_{PAD}$ (equations 6 and 7). With, for example, input signal 195 having a potential $V_{GS\ N1}$ smaller than $V_{th\ N}$ (equation 9), N1 is non-conductive. N2 and N2 are also non-conductive due to source voltages floating in reference to line 119. Voltages $V_{DS\ 1}$ (trace 240) $V_{DS\ 1} + V_{DS\ 2}$ (trace 230) and $V_{PAD}$ (220) are stable. According to equations (11) to (13), P1 is (a) conductive with $V_{PAD}$ =5.5 volts>$V_{CC}$=3.3 volts, so that $V_{GN3} \approx V_{PAD}$ (traces 210 and 220).

At time point $t_1$, input signal 195 switches N1 into the conductive state and $V_{DS\ 1}$ goes (trace 241) to zero (e.g., 0 volts) at line 119. With the drain (D) of N1 and the source (S) of N2 having decreasing potential and the gate (G) of N2 at VCC, N2 also becomes conductive (equation 9) and $V_{DS\ 1} + V_{DS\ 2}$ also goes to zero (trace 231). In other words, the distance between traces 231/241 is smaller than between traces 230/240. With its source (S) being pulled down by N1 and N2, the increasing value at $V_{GS\ 3}$ makes transistor N3 conductive. With all transistors N1, N2, and N3 being conductive, $V_{PAD}$ goes to zero (trace 221). The initially high voltage $V_{PAD}$ (at time t=$t_1$) across conductive transistors N1, N2, N3 is distributed into smaller fractions (under trace 241, between traces 231/241, and between traces 221/231), each being smaller than $V_{DS\ MAX}$, so that not only transistor N1, but also transistors N2 and N3 are protected against stress. With $V_{PAD}$ going below $V_{CC}$, conductive transistor P2 of comparator 150 provides $V_{GN3} \approx V_{CC}$ (equations 15–17). The transition interval $t_1$ to $t_2$ is finished at time t=$t_2$ when $V_{PAD}$ and all other across-the-transistor voltages $V_{DS\ 1,2,3}$ reach substantially zero (traces 222, 232, 242). $V_{GN3}$ stays at about $V_{CC}$ (trace 212).

It is important to mention, that during the transition time interval ($t_1$, $t_2$), $V_{DS\ 3}$ across transistor N3 is reduced (between traces 221 and 231). This is due to the increasing conductivity of N3. For understanding, the reader can imagine that the gate (G) of N3 is connected to line 191 at $V_{CC}$. N3 would not have sufficient conductivity when pull-down device 101 is switched on, so that an unwanted delay would be the result. According to the present invention, the conductivity of N3 is substantially always at the highest possible value. This is accomplished by keeping its gate (G) at the highest possible potential ($V_{PAD}$ or $V_{CC}$).

In general terms, the method of the present invention can be described as method for protecting a N-channel field effect transistor (e.g., N-FET N1) with a variable drain-source voltage $V_{DS1}$ against a voltage $V_{PAD}$ which appears at a node (e.g., node 115) and which is at times $V_{PAD} \geq V_{DS\ MAX}$ N-FET N3 is serially coupled to N-FET N1 and adds thereby a variable drain-source voltage $V_{DS\ 3}$ to $V_{DS\ 1}$. The method of the present invention is applicable when pull-down device 101 (with e.g., N1) pulls node 115 to reference line 119 similar to the pull-down operation described in connection with FIG. 2. The pull-up operation when pull-up device 116 pulls node 115 to line 119 is not considered here, since N1 is not conductive in that case. The method comprises the following steps:

(i) Comparing $V_{PAD}$ to a voltage $V_{CC} \leq V_{DS\ MAX}$. Preferably, this step is performed by a comparator, such as comparator 150, but other implementations are also possible.

In the preferred embodiment, $V_{PAD}$ and $V_{CC}$ are supplied to gates (G) of P-FETs P1and P2, respectively, which are alternatively conductive and non-conductive.

(ii) Changing the conductivity of N-FET N3 so that $V_{PAD}$ is distributed among $V_{DS\ 1}$ and $V_{DS\ 3}$ and $V_{DS\ 1}$ is smaller than $V_{DS\ MAX}$. Preferably, the conductivity of N-FET N3 is changed by coupling a gate (G) of N-FET N3

(a) to $V_{PAD}$ (if $V_{PAD} \geq V_{CC}$) by P1 obtaining high conductivity or (b) to $V_{CC}$ (if $V_{CC} \geq V_{PAD}$) by P2 obtaining low conductivity.

The present invention allows one to design I/O-connections which can be used as interface between circuits having different supply voltages (e.g., of $V_{CC\ 1}$=3.3 volts and $V_{CC\ 2}$=5 volts). The voltage sensitive transistor therein are protected without the need of a second supply voltage (as e.g., $V_{CC\ 2}$ in prior art circuit 11). Circuit 100 as part of an I/O connection can accommodate signal voltages (e.g., $V_{PAD}$) which it does not produce internally (e.g., 5 volts). This makes it easy for so called plug-and-play applications. The comparator, as e.g., comparator 150 with two P-FETs can be implemented with smaller dimensions than pull-down device 101. The additional circuitry (e.g., P1, P2, N2, N3) used to protect a voltage sensitive transistor (e.g., N1) is small in chip area compared to the sensitive transistor itself. Moreover, due to enhanced protection, the sensitive transistor can be implemented with less chip area.

The invention has been described in detail, by way of example only, with reference to a preferred embodiment thereof. In the description, numerous specific details have been set forth such as examples of voltages and particular transistor configurations, etc., in order to provide a thorough understanding of the present invention. It will be evident, however, to those skilled in the art that such specific details are not necessarily required in order to practice the invention. In other instances, well known structures and circuits not relating to the invention have been omitted or simplified in order to avoid unnecessarily obscuring the invention.

The present invention provides cost saving protection circuitry which allows I/O connections which accommodate high signal voltages. Compared to the prior art, an additional serial pull-down transistor and two transistors in a logic, consuming preferably, only a small chip area, provide effective protection against the above-mentioned hot-electron effects. The circuit of the present invention needs only a single supply voltage which is, preferably, a low supply voltage. The logic controls the additional transistor and ensures an additional voltage across the additional transistor needed for protection.

While the invention has been described in terms of particular structures, steps, devices and materials, those of skill in the art will understand based on the description herein that it is not limited merely to such examples and that the full scope of the invention is properly determined by the claims that follow.

We claim:

1. A circuit, comprising;
    a first reference terminal having a first voltage with a value $V_{R1}$;
    a second reference terminal having a second voltage with a value $V_{R2}$;
    a node for coupling said circuit to a further circuit, wherein said further circuit temporarily applies a third voltage with a value $V_{PAD}$ to said node;
    a comparator having inputs respectively coupled to said second reference terminal and to said node and having an output; and
    a first transistor having a first main electrode, a second main electrode and a control electrode, and a second transistor having a first main electrode, a second main electrode and a control electrode, said first main electrode of said first transistor being coupled to said second main electrode of said second transistor, said second main electrode of said first transistor being coupled to said first reference terminal, said first main electrode of said second transistor being coupled to said node, wherein a first potential difference $V_{DS\ 1}$ is dropped between said first and second main electrodes of said first transistor and a second potential difference $V_{DS\ 3}$ is dropped between said first and second main electrodes of said second transistor, said control electrode of said first transistor receiving an input signal; said control electrode of said second transistor being coupled to said output of said comparator,
    wherein said comparator compares $V_{PAD}$ to $V_{R2}$ and activates said control electrode of said second transistor so that $V_{DS}\ 1$ is less than a predetermined maximum voltage when $V_{PAD} > V_{R2}$.

2. The circuit of claim 1 further comprising a third transistor having a first main electrode, a second electrode, and a control electrode, said first main electrode and said second main electrode of said third transistor being inserted between said first transistor and said second transistor, said control electrode of said third transistor coupled to said second reference terminal.

3. The circuit of claim 2 wherein said first transistor, said second transistor, and said third transistor are N-channel field effect transistors (N-FETs), wherein each of the first main electrodes is a drain, each of the second main electrodes is a source, and each of the control gates thereof is a gate.

4. The circuit of claim 1 wherein said comparator has a fourth transistor and a fifth transistor, each having main electrodes and a control electrode, said fourth and fifth transistors being serially coupled with said main electrodes between said second reference terminal and said node and having said control electrodes as said inputs.

5. The circuit of claim 1 wherein said comnparator has a first P-channel field effect transistor (P-FET) and a second P-FET, said first and second P-FETs being serially coupled with their sources Coupled to said node and to said second reference terminal, respectively, drains of said first and second P-FETs being coupled together and forming said output of said comparator, a gate of said first P-FET being coupled to the source of said second P-FET and a gate of said second P-FET being coupled to the source of said first P-FET, said first and second P-FETs pulling said control electrode of said second transistor alternatively to said node or to said second reference terminal, whichever has higher potential.

6. A circuit being coupled to a first line voltages a second line voltage, and to a third line voltage, said circuit receiving a substantially constant voltage $V_{CC}$ between said second line voltage and said first line volt and receiving a variable voltage $V_{PAD}$ between said third line and said first line voltage, said circuit comprising:
    a voltage sensitive component having main electrodes serially coupled between said third line voltage and said first line voltage, a voltage $V_{DS\ 1}$ being dropped across said main electrodes smaller than a break down voltage $V_{DS\ MAX}$ of said voltage sensitive component, an inpedance of said voltage sensitive component being changed depending on an input signal applied to a first control input of said voltage sensitive component;
    a transistor having two main electrodes which are serially coupled to said main electrodes of said voltage sensitive component, a voltage $V_{DS\ 3}$ being dropped across said main electrodes of said transistor such that $V_{DS\ 1} + V_{DS\ 3} < V_{PAD}$ and $V_{DS\ 1} < V_{DS\ MAX}$, said transistor having a control input; and
    a comparator having switches, said comparator comparing $V_{PAD}$ and $V_{CC}$ and providing to said control input of said transistor
        (a) said third line voltage when a magnitude of potential difference between said third line voltage and said first line voltage is higher than a magnitude of potential difference between said second line voltage and said first line, and
        (b) said second line voltage when the magnitude of potential difference between said second line voltage and said first line voltage is higher than the magnitude of potential difference between said third line and said first line.

7. The circuit of claim 6 wherein said voltage sensitive component is a N-channel field effect transistor.

8. The circuit of claim 6 wherein said voltage sensitive component is a FET and said main electrodes are coupled between one main electrode of said transistor and said first line voltage.

9. The circuit of claim 6 wherein said comparator provides to said control input of said transistor (a) said third line voltage when $V_{PAD} > V_{CC}$ and (b) said second line voltage when $V_{CC} < V_{PAD}$.

10. The circuit of claim 6 wherein said comparator provides to said control input said second line voltage or third line voltage which has higher potential.

11. The circuit of claim 6 wherein said comparator provides to said second control input either (a) said $V_{PAD}$ when $V_{PAD} > V_{CC}$ or (b) said $V_{CC}$ when $V_{CC} > V_{PAD}$.

12. The circuit of claim 6 further comprising a second transistor serially coupled to said voltage sensitive component.

13. The circuit of claim 6 wherein said comparator is a serial arrangement of P-channel field effects (P-FETs) between said second and third lines, said P-FETs having gates cross-coupled to said second and third lines and, when conductive, pulling said control input to said either said second line or to said third line.

14. A method for protecting a first N-channel field effect transistor (N-FET) with a variable drain-source voltage $V_{DS\ 1}$ against an externally provided voltage $V_{PAD}$ which appears at a node to which the first NFET is coupled wherein there is a second N-FET serially coupled to said first N-FET, said second N-FET adding a variable drain-source voltage $V_{DS\ 3}$ to $V_{DS\ 1}$, said method comprising the steps of:

(i) comparing $V_{PAD}$ to a reference voltage $V_{CC}$ which is less than $V_{DS\ MAX}$ using switches coupled between $V_{CC}$ and $V_{PAD}$ for providing an output voltage to said gate of said second transistor, wherein $V_{DS\ MAX}$ is a breakdown voltage of the first N-FET; and (ii) changing the conductivity of said second N-FET between drain and source depending on a comparison result in step (i) by varying said output voltage at said second N-FET so that $V_{PAD}$ is distributed among $V_{DS\ 1}$ and $V_{DS\ 3}$ and that the value of $V_{DS\ 1}$ is limited to $V_{DS\ 1} < V_{DS\ MAX}$.

15. The method of claim 14 wherein in said comparing step, $V_{PAD}$ and $V_{CC}$ are supplied to gates of first and second P-channel field effect transistors (P-FETs) which are alternatively conductive and non-conductive so that in said coupling step said gate of said second N-FET is coupled to $V_{CC}$ by said first P-FET or coupled to $V_{PAD}$ by said second P-FET.

* * * * *